United States Patent [19]
Ganninger et al.

[11] Patent Number: 5,965,842
[45] Date of Patent: *Oct. 12, 1999

[54] LOW IMPEDANCE CONNECTION FOR AN EMI CONTAINMENT SHIELD INCLUDING METAL PLATING BONDED TO THE SHIELDED EQUIPMENT THROUGH OPENINGS IN A CONDUCTIVE RIBBON

[75] Inventors: Mark E. Ganninger, Round Rock; Herb W. Blair, Carrollton, both of Tex.

[73] Assignee: Dell USA, L.P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/785,209

[22] Filed: Jan. 17, 1997

[51] Int. Cl.$^6$ ........................................... H05K 9/00
[52] U.S. Cl. ...................... 174/35 R; 174/51; 174/35 C
[58] Field of Search ............................... 349/59; 174/254, 174/256, 35 R, 35 MS, 255, 51, 35 C, 35 GC; 361/749, 750, 751, 816, 818; 228/185, 180.1; 29/843

[56] References Cited

U.S. PATENT DOCUMENTS

| | | | |
|---|---|---|---|
| 5,017,419 | 5/1991 | Smith | 428/209 |
| 5,330,365 | 7/1994 | Leeson | 439/77 |
| 5,500,789 | 3/1996 | Miller et al. | 361/816 |
| 5,519,585 | 5/1996 | Jones et al. | 361/818 |
| 5,631,446 | 5/1997 | Quan | 174/254 |

Primary Examiner—Kristine Kincaid
Assistant Examiner—Hung V Ngo
Attorney, Agent, or Firm—Skjerven, Morrill, MacPherson, Franklin & Friel LLP; Ken J. Koestner

[57] ABSTRACT

The present invention provides an EMI shield having a low impedance connection to ground for use in electronic equipment, particularly computer systems. More particularly, an EMI shield for electronic equipment is disclosed which includes a conductive ribbon, such as a copper ribbon with a polyimide backing, the conductive ribbon having openings and coupled to a ground plane. The conductive ribbon contacts a surface of a section of the electronic equipment to be shielded. A hold down frame of a non-conductive material holds the conductive ribbon in a fixed position on the section of the electronic equipment to be shielded. A metal plating, such as a combination of copper and nickel, bonds to the section of the electronic equipment to be shielded and to the conductive ribbon. The metal plating contains the EMI. The plating also bonds to the section of the electronic equipment through the openings of the conductive ribbon wherein the metal plating and the conductive ribbon form a low impedance connection to ground. In one embodiment the openings in the conductive ribbon are slots and in another the openings are circular holes.

18 Claims, 2 Drawing Sheets

LOW IMPEDANCE CONNECTION FOR AN EMI CONTAINMENT SHIELD INCLUDING METAL PLATING BONDED TO THE SHIELDED EQUIPMENT THROUGH OPENINGS IN A CONDUCTIVE RIBBON

BACKGROUND OF THE INVENTION

1. Field of the Invention

The present invention generally relates to a computer apparatus, and, more particularly, to the electromagnetic interference (EMI) shielding of personal computers.

2. Description of the Related Art

Radiation sources for electromagnetic waves have been increasing in number with continued advances in industrial technology. The leakage of electromagnetic waves, therefore, has become a significant problem since the wave can exert adverse influences on the human body and cause incorrect behavior of integrated circuits in electronic equipment, particularly electronic computers.

With the constant technological advances in the computer industry, such as faster, higher resolution displays, faster memory, faster processors, etc., comes the problem of EMI containment and shielding. Personal computer systems have attained widespread use in the world. These personal computing systems now provide computing power to many segments of today's modern society. A personal computer system can usually be defined as a desktop, floor-standing, or portable microcomputer that includes a system unit having a system processor with associated volatile and non-volatile memory, a display monitor, a keyboard, one or more floppy diskette drives, a hard disk storage device and an optional printer. One of the distinguishing characteristics of these systems is the use of a system board or mother board, which includes a ground plane, and which electrically connects these components together. In general, since metals can absorb or reflect electromagnetic waves, they are effectively used as shielding materials. In addition, plastics with metals deposited thereon, or plating, can be used for the same purpose, for example, metal plating of either the plastics in portable computers or the chassis in desktop computers.

Plating is used in portable and desktop computers to provide a Faraday Cage (an arrangement of a conducting sheet or conducting mesh bonded together so that an EMI shield is provided, but connected in such a way that induced currents cannot circulate) to contain EMI. The plating contains the EMI and, through a ground path connection, directs it to the ground plane. For the plating to be most effective, the ground path connection should have the least impedance possible. Mechanical methods, such as wires screwed to the plating, copper or metal grounding straps contacting the plating and ground are used to make the connection to ground. Other methods involve plating touching plating or some other metal component connected to the ground plane. These methods create a high impedance connection, thus limiting the effectiveness of the plating. Accordingly, a design and method is needed which creates a low impedance connection between the plating and the ground plane.

SUMMARY OF THE INVENTION

The present invention provides an EMI shield having a low impedance connection to ground for use in electronic equipment, particularly computer systems. More particularly, an EMI shield for electronic equipment is disclosed which includes a conductive ribbon, such as, for example, a copper ribbon with a polyimide backing, the conductive ribbon having openings and coupled to a ground plane. The conductive ribbon contacts a surface of a section of the electronic equipment to be shielded. A hold down frame of a non-conductive material holds the conductive ribbon in a fixed position on the section of the electronic equipment to be shielded. A metal plating, such as a combination of copper and nickel, bonds to the section of the electronic equipment to be shielded and to the conductive ribbon. The metal plating contains the EMI. The plating also bonds to the section of the electronic equipment through the openings of the conductive ribbon wherein the metal plating and the conductive ribbon form a low impedance connection to ground. In one embodiment the openings in the conductive ribbon are slots and in another the openings are circular holes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
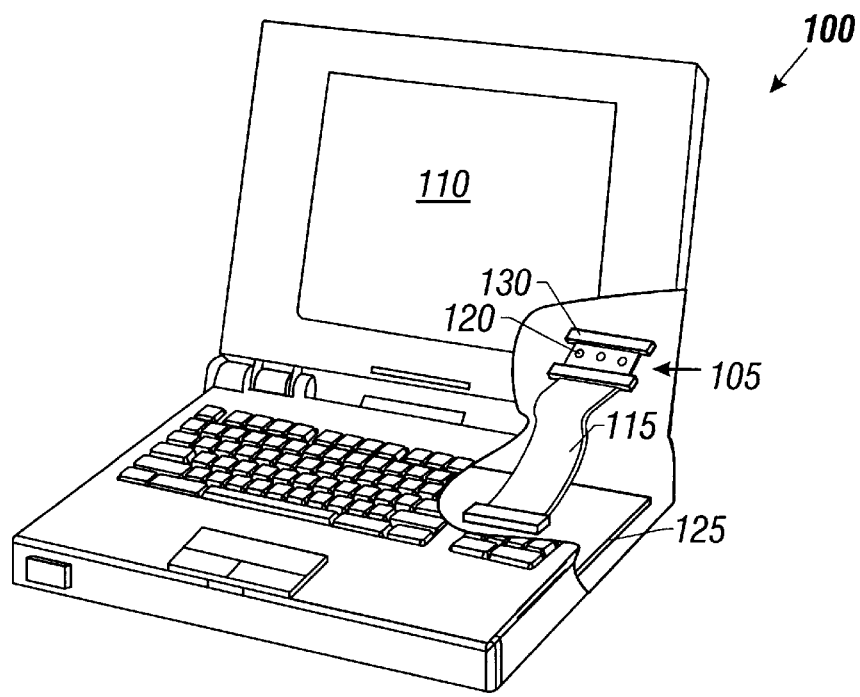
FIG. 1 is a cut-away view of a portable computer system including the EMI shield and low impedance connection according to the present invention.

Referring to FIG. 1, a portable computer 100 is illustrated with a cut-away section to show the EMI shield and low impedance connection 105 of the present invention. The shielded section illustrated in this figure is the display 110 of the computer 100. A flexible conductive ribbon 115 having openings 120 is coupled to a ground plane on the computer 100 motherboard 125. The conductive ribbon contacts a surface, usually plastic, of the display 110. A holding means, such as a hold down frame 130, usually plastic strips or some other nonconductive material, holds the conductive ribbon 115 in a fixed position on the display 110. A metal plating (not shown in this figure), such as a combination of copper and nickel, chemically bonds to the display 110, usually plastic, and to the conductive ribbon 115. The plating also bonds to the display 110 through the openings 120 of the conductive ribbon 115 forming a low impedance connection to ground. The openings 120 are preferably circular holes, as illustrated in this embodiment, however the openings 120 may be of many shapes or sizes, such as the slots or fingers illustrated in a second embodiment and discussed below. The hold down frame 130 is attached to the display 110 in any conventional manner.

Figure 2:
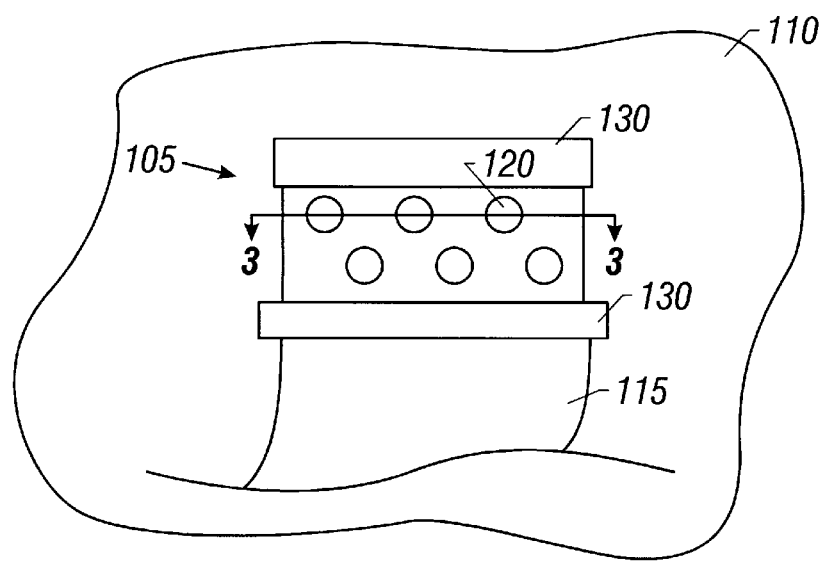
FIG. 2 is a top view of a first embodiment of the EMI shield connection according to the present invention.
Figure 3:
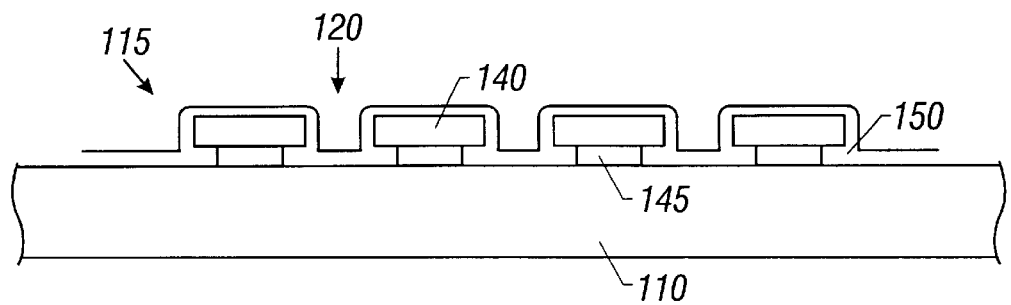
FIG. 3 is a cross sectional view taken along lines 3—3 of FIG. 2.

Prior methods of connecting a conductive ribbon to an object to be shielded included plating the object and then simply placing a conductive ribbon over the plating and clamping the ribbon to the object. This produces a high impedance connection to ground which is much less effective in shielding or containing EMI. FIG. 2 is a top view of a first embodiment of the EMI shield connection 105 wherein the openings 120 on the conductive ribbon 115 are circular holes, and FIG. 3 is a cross sectional view taken along lines 3—3 of FIG. 2. The openings 120 may be placed in any optimally spaced configuration. As shown in FIG. 3, the conductive ribbon 115 is, for example, a copper ribbon 140 with a polyimide backing 145, such as Mylar™. The polyimide backing 145 of the conductive ribbon 115, for instance, contacts the surface of the display 110, which is usually a plastic surface. However, the copper ribbon 140 may, instead, be placed in contact with the surface of the display 110 in the present invention. The metal plating 150 bonds to the plastic of the display 110 and to the copper ribbon 140 of the conductive ribbon 115. The plating 150 also bonds to the plastic of the display 110 through the openings 120 of the conductive ribbon 115 forming a low impedance connection between the plating 150 and the copper ribbon 140 to ground. Although the plating 150 is illustrated as covering the copper ribbon 140 entirely, the copper ribbon 140 may be masked such that the plating 150 bonds only to the sides of the copper ribbon 140 in the openings 120. In FIG. 3 the polyimide backing 145 is illustrated as etched away from the edges of the openings 120 providing better bonding and lower impedance, however, a low impedance connection is achieved without etching the polyimide backing 145.

Figure 4:
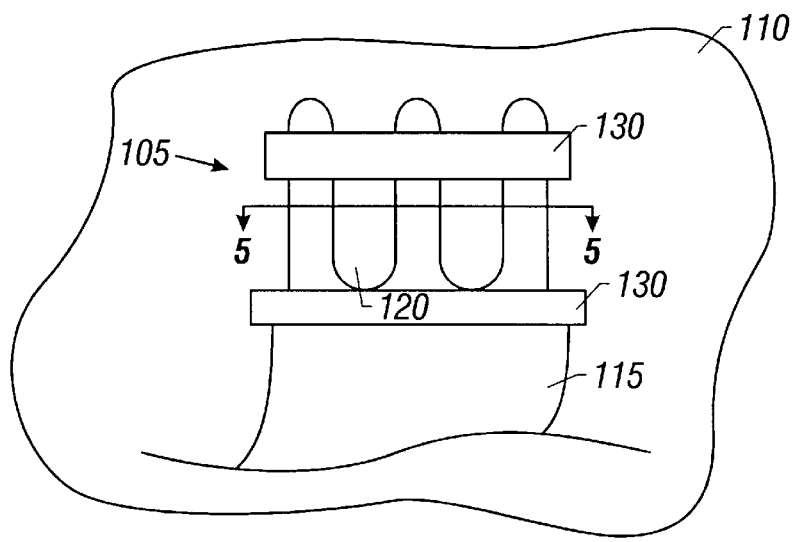
FIG. 4 is a top view of a second embodiment of the EMI shield connection according to the present invention.
Figure 5:
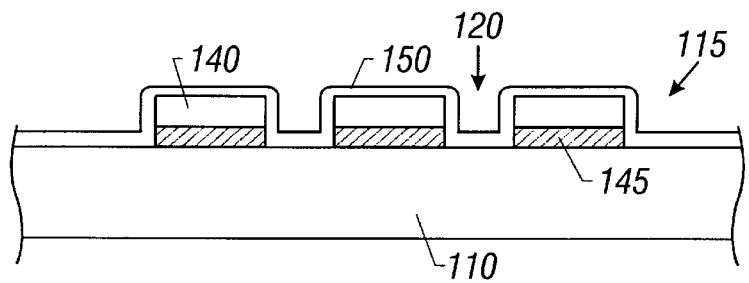
FIG. 5 is a cross sectional view taken along lines 5—5 of FIG. 4.

FIG. 4 and FIG. 5 illustrate a second embodiment of the present invention wherein the openings 120 in the conductive ribbon 115 are slots or fingers.

In the method of the present invention for connecting an electromagnetic interference (EMI) shield on a display, for instance, of a computer the conductive ribbon having openings is coupled to ground and contacts a surface of the display. The conductive ribbon is held in a fixed position on the display with a hold down frame. The metal plating is chemically bonded to the display and to the conductive ribbon including bonding to the display through the openings of the conductive ribbon forming a low impedance ground path connection.

While the invention has been described with reference to various embodiments, it will be understood that these embodiments are illustrative and that the scope of the invention is not limited to them. Many variations, modifications, additions and improvements of the embodiments described are possible. For example, the disclosed method and design may be used on any type of electronic equipment where EMI shielding is desirable. The low impedance connection disclosed in the present invention may also be used where the conductive ribbon connects with the ground plane of a motherboard.

What is claimed is:

1. An electro-magnetic interference (EMI) shield for shielding EMI in an electronic equipment comprising:

a ground plane;

a conductive ribbon having bond openings, the conductive ribbon being coupled to the ground plane and contacting a surface of a section of the electronic equipment to be shielded;

a hold down frame of a non-conductive material holding the conductive ribbon in a fixed position on the section of the electronic equipment to be shielded; and a metal plating deposited upon and bonded to the conductive ribbon and deposited extending through the bond openings of the conductive ribbon to bond directly, without intervening connectors, to a section of a structural enclosure of the electronic equipment to be shielded, the metal plating containing EMI and forming a low impedance connection with the ground plane and the conductive ribbon.

2. An EMI shield, as recited in claim 1, wherein:
   the openings in the conductive ribbon are slots.

3. An EMI shield, as recited in claim 1, wherein:
   the openings in the conductive ribbon are circular holes.

4. An EMI shield, as recited in claim 1, wherein:
   the conductive ribbon is a copper ribbon having a polyimide backing and wherein the metal plating chemically bonds to the copper.

5. An EMI shield, as recited in claim 1, wherein:
   the metal plating is a combination of copper and nickel.

6. An EMI shield, as recited in claim 1, wherein:
   the metal plating is chemically bonded to the conductive ribbon and chemically bonded through the bond openings to the section of the structural enclosure of the electronic equipment to be shielded.

7. An EMI shield, as recited in claim 1, herein the structural enclosure is:
   a chassis of a desktop computer or a plastic housing of a portable computer.

8. A computer having a section shielded from electromagnetic interference (EMI) comprising:

a ground plane;

a conductive ribbon having bond openings, the conductive ribbon being coupled to the ground plane and contacting a surface of a section of a structural enclosure of the computer that shielded;

a holding means of a non-conductive material for holding the conductive ribbon in a fixed position on the section shielded; and a metal plating deposited upon and bonded to the conductive ribbon and extending through the bond openings of the conductive ribbon to bond directly, without intervening connectors, to the section of the structural enclosure of the computer that is shielded, the metal plating containing EMI and forming a low impedance connection with the ground plane and the conductive ribbon.

9. A computer having a section shielded, as recited in claim 8, wherein:
   the openings in the conductive ribbon are slots.

10. A computer having a section shielded, as recited in claim 8, wherein:
    the openings in the conductive ribbon are circular holes.

11. A computer having a section shielded, as recited in claim 8, wherein:
    the conductive ribbon is a copper ribbon having a polyimide backing and wherein the metal plating bonds to the copper.

12. A computer having a section shielded, as recited in claim 8, wherein:
    the metal plating is a combination of copper and nickel.

13. A computer, as recited in claim 8, wherein:
    the metal plating is chemically bonded to the conductive ribbon and chemically bonded through the bond openings to the section of the structural enclosure of the electronic equipment to be shielded.

14. A method for connecting an electro-magnetic interference (EMI) shield on a section of a structural enclosure of an electronic equipment, the method comprising:

coupling a conductive ribbon to ground, the conductive ribbon having bond openings and contacting a surface of the section of the structural enclosure of the electronic equipment;

holding the conductive ribbon using a hold down frame of a non-conductive material in a fixed position on the section of the structural enclosure of the electronic equipment;

depositing a metal plating;

bonding the deposited metal plating to the conductive ribbon;

extending the metal plating deposition through the bond openings in the conductive ribbon; and bonding the metal plating extending through the bond openings directly, without connection to an intervening connector, to the section of the structural enclosure of the electronic equipment, the metal plating containing EMI and forming a low impedance connection to ground and the conductive ribbon.

15. A method, as recited in claim 14, wherein:

the openings in the conductive ribbon are slots.

16. A method, as recited in claim 14, wherein:

the openings in the conductive ribbon are circular holes.

17. A method, as recited in claim 14, wherein:

the conductive ribbon is a copper ribbon having a polyimide backing and wherein the metal plating bonds to the copper.

18. A method, as recited in claim 14, wherein:

the metal plating is a combination of copper and nickel.

* * * * *